United States Patent
Hsieh

(10) Patent No.: US 8,227,291 B2
(45) Date of Patent: Jul. 24, 2012

(54) METHOD OF MANUFACTURING STACKED-LAYERED THIN FILM SOLAR CELL WITH A LIGHT-ABSORBING LAYER HAVING BAND GRADIENT

(75) Inventor: Feng-Chien Hsieh, Houli Township, Taichung County (TW)

(73) Assignee: Nexpower Technology Corp., Taichung County (TW)

( * ) Notice: Subject to any disclaimer, the term of this patent is extended or adjusted under 35 U.S.C. 154(b) by 353 days.

(21) Appl. No.: 12/557,135

(22) Filed: Sep. 10, 2009

(65) Prior Publication Data

US 2010/0075457 A1 Mar. 25, 2010

(30) Foreign Application Priority Data

Sep. 19, 2008 (TW) .............................. 97135928 A

(51) Int. Cl.
*H01L 21/00* (2006.01)

(52) U.S. Cl. ............ 438/93; 438/94; 257/185; 257/191; 257/E21.09

(58) Field of Classification Search .................. 257/185, 257/191, 196, E21.09; 438/93–94

See application file for complete search history.

(56) References Cited

U.S. PATENT DOCUMENTS

| 5,028,274 | A | | 7/1991 | Basol |
| 5,441,897 | A | | 8/1995 | Noufi |
| 6,092,669 | A | * | 7/2000 | Kushiya et al. ............ 204/298.13 |
| 2003/0054663 | A1 | * | 3/2003 | Stanbery ....................... 438/765 |
| 2008/0096307 | A1 | * | 4/2008 | Basol ............................ 438/104 |

OTHER PUBLICATIONS

Haimbodi, M.W. "Cu(InAl)Se$_2$ thin films and devices deposited by multisource evaporation". Photovoltaic Specialists Conference, 2000. Conference Record of the Twenty-Eighth IEEE pp. 454-457.*

* cited by examiner

*Primary Examiner* — Thao Le
*Assistant Examiner* — Allen Parker
(74) *Attorney, Agent, or Firm* — Ming Chow; Sinorica, LLC

(57) ABSTRACT

A method of manufacturing a stacked-layered thin film solar cell with a light-absorbing layer having a band gradient is provided. The stacked-layered thin film solar cell includes a substrate, a back electrode layer, a light-absorbing layer, a buffer layer, a window layer, and a top electrode layer stacked up sequentially. The light-absorbing layer has a band gradient structure and is essentially a group I-III-VI compound, wherein the group III elements at least include indium (In) and aluminum (Al). Moreover, the Al/In ratio in the upper half portion of the light-absorbing layer is greater than that in the lower half portion of the light-absorbing layer, wherein the upper half portion is proximate to a light incident surface.

17 Claims, 4 Drawing Sheets

METHOD OF MANUFACTURING STACKED-LAYERED THIN FILM SOLAR CELL WITH A LIGHT-ABSORBING LAYER HAVING BAND GRADIENT

BACKGROUND OF THE INVENTION

1. Field of the Invention

The present invention relates to stacked-layered thin film solar cells and, more particularly, to a stacked-layered thin film solar cell with a light-absorbing layer having a band gradient and comprising indium and aluminum.

2. Description of the Prior Art

Solar cells are p-n junction semiconductor devices that directly generate electricity from sunlight through a process known as the photovoltaic effect. To meet the demand for thin solar cells, stacked-layered thin film solar cells have heretofore been a trend for the solar industry. The most important advantage of stacked-layered thin film solar cells is that they are cost-competitive, though problems with their efficiency and stability remain unsolved.

At present, the light-absorbing layer of a stacked-layered thin film solar cell is mostly made of amorphous silicon, copper indium diselenide ($CuInSe_2$, often abbreviated as "CIS"), or copper indium gallium diselenide ($CuInGaSe_2$, often abbreviated as "CIGS"). It is because the aforesaid materials are semiconductor materials with a direct band gap and, more particularly, have the following advantageous features: a band gap value that matches most of the solar spectrum, a high absorption coefficient, and being capable of creating a p-n junction by modification of their compositions.

Referring to FIG. 1, a CIS stacked-layered thin film solar cell 1 includes a plurality of thin-film layers, namely a substrate 10, a back electrode layer 11, a light-absorbing layer 12, a buffer layer 13, a window layer 14, and a top electrode layer 15, arranged from bottom to top. The CIS stacked-layered thin film solar cell 1 is made essentially of chalcopyrite, which is a group I-III-VI compound and exhibits high resistance to interference and radiation, and therefore leads a long service life. CIGS stacked-layered thin film solar cells, on the other hand, evolved from CIS stacked-layered thin film solar cells by replacing, in part, the element indium thereof with the element gallium. CIGS stacked-layered thin film solar cells absorb light whose energy ranges from 1.02 ev to 1.68 ev, depending on the indium and gallium content of the solar cells, and are more efficient than CIS stacked-layered thin film solar cells in light emission.

Nowadays, the light-absorbing layers of CIS stacked-layered thin film solar cells and of CIGS stacked-layered thin film solar cells are usually manufactured by sputtering deposition, vapor deposition, or electroplating. In this regard, a conventional manufacturing process involves sputtering copper, indium, and gallium so as to make a film, and then selenizing the film. Alternatively, another conventional manufacturing process involves co-vapor deposition of copper, indium, gallium, and selenium, which is more efficient but also more complicated.

The element indium and the element gallium used in manufacturing CIS stacked-layered thin film solar cells and CIGS stacked-layered thin film solar cells, respectively, are precious metals which incur high costs to the detriment of mass production. Also, band gap discontinuity between the light-absorbing layer 12 and the buffer layer 13 remains an unsolved problem. Hence, there is still room for improvement in the prior art.

SUMMARY OF THE INVENTION

To overcome the above drawbacks of the prior art, the present invention provides a stacked-layered thin film solar cell with a light-absorbing layer having a band gradient. The stacked-layered thin film solar cell of the present invention is formed by stacking sequentially a plurality of layers, namely a substrate, a back electrode layer, a light-absorbing layer, a buffer layer, a window layer, and a top electrode layer. The light-absorbing layer has a band gradient and is essentially a I-III-VI compound, wherein the group III elements at least include indium (In) and aluminum (Al). The aluminum to indium (Al/In) ratio in the upper half portion of the light-absorbing layer is greater than that in the lower half portion of the light-absorbing layer, wherein the upper half portion is proximate to a light incident surface.

Hence, it is a primary objective of the present invention to provide a stacked-layered thin film solar cell with a light-absorbing layer having a band gradient so as to increase the efficiency of light emission.

A secondary objective of the present invention is to provide a stacked-layered thin film solar cell with a light-absorbing layer having a band gradient so as to reduce manufacturing costs.

Yet another objective of the present invention is to provide a stacked-layered thin film solar cell with a light-absorbing layer having a band gradient so as to enhance process stability.

DETAILED DESCRIPTION OF THE PREFERRED EMBODIMENT

The present invention discloses a stacked-layered thin film solar cell with a light-absorbing layer having a band gradient, wherein the principle of photoelectric conversion of solar energy is comprehensible to persons ordinarily skilled in the art and therefore is not described in detail hereunder. Likewise, the drawings referred to in the following description are intended to illustrate the technical features of the present invention only schematically and therefore are not, and need not be, drawn to full scale.

Figure 1:
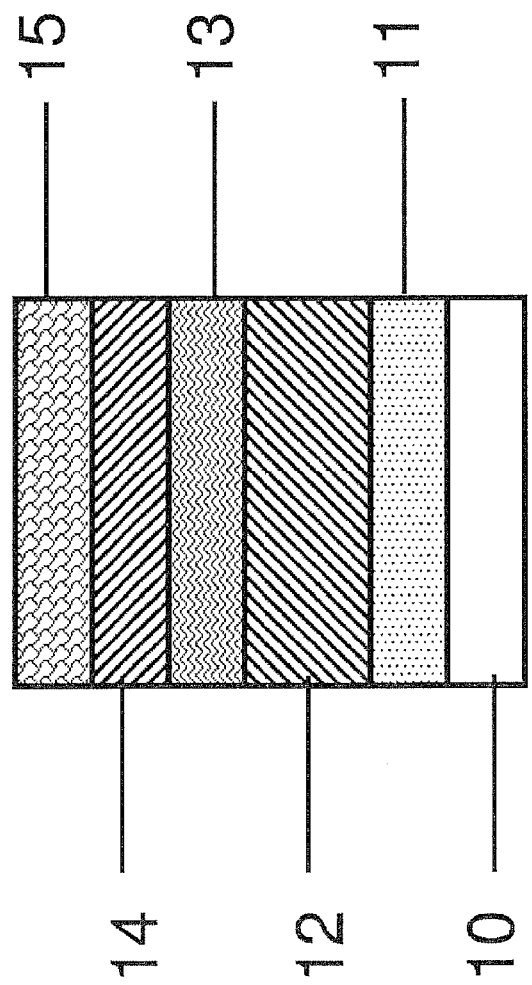
FIG. 1 is a cross-sectional schematic view of a stacked-layered thin film solar cell according to the prior art.
Figure 2:
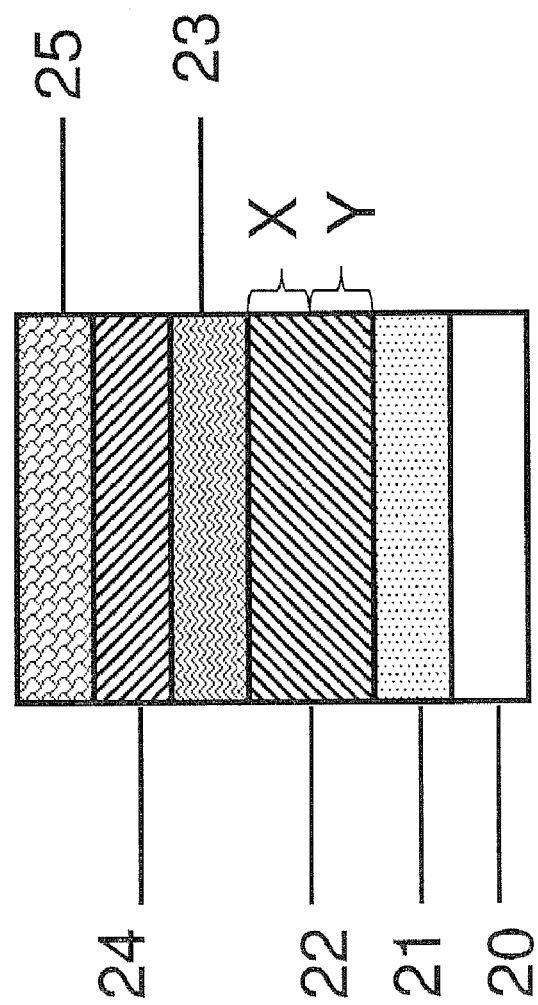
FIG. 2 is a cross-sectional schematic view of a first preferred embodiment of the present invention, namely a stacked-layered thin film solar cell with a light-absorbing layer having a band gradient.

Please refer to FIG. 2 for a cross-sectional schematic view of a stacked-layered thin film solar cell 2 with a light-absorbing layer having a band gradient according to a first preferred embodiment of the present invention. The stacked-layered thin film solar cell 2 with a light-absorbing layer having a band gradient is formed by stacking sequentially a plurality of layers, namely a substrate 20, a back electrode layer 21, a light-absorbing layer 22, a buffer layer 23, a window layer 24, and a top electrode layer 25.

Figure 3:
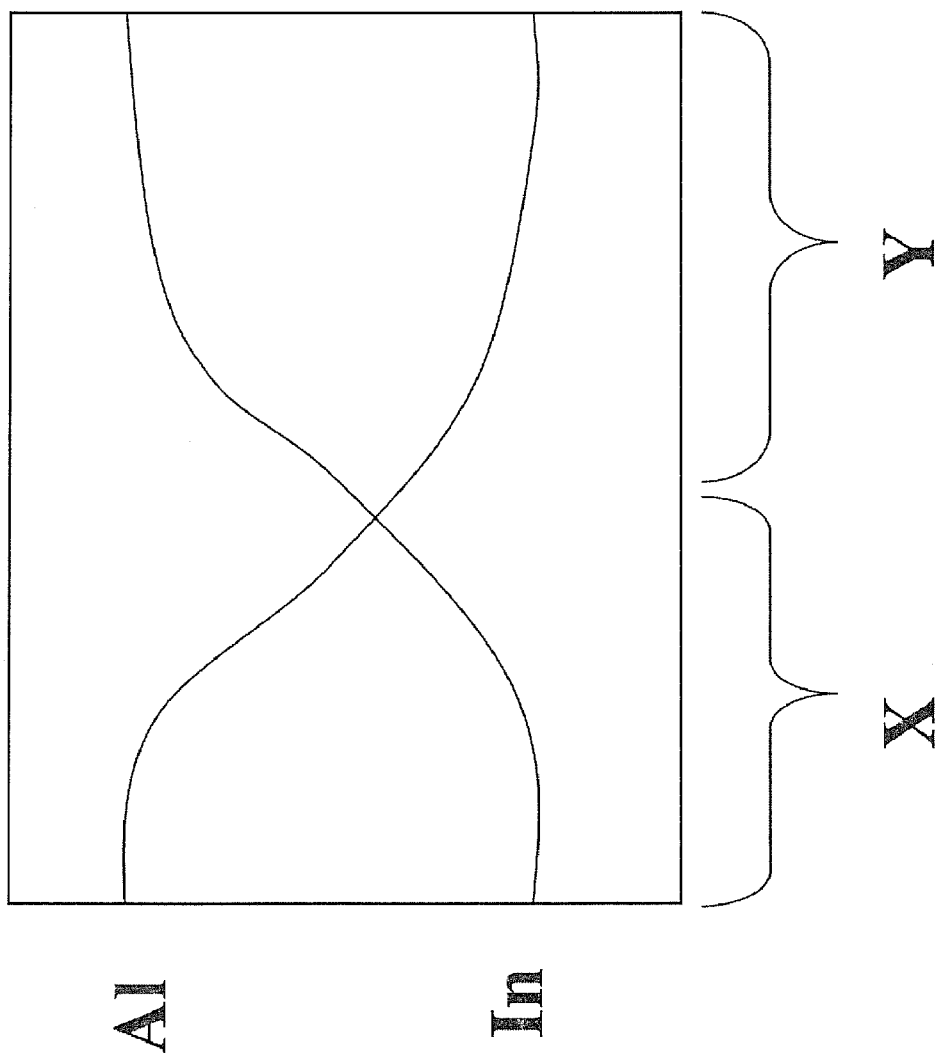
FIG. 3 is a graph of aluminum and indium content percentages of the upper half portion and the lower half portion of a light-absorbing layer in the first preferred embodiment of the present invention.

The light-absorbing layer 22 has a band gradient and is essentially a I-III-VI compound, wherein the group III elements at least include indium (In) and aluminum (Al). The aluminum to indium (Al/In) ratio in the upper half portion X of the light-absorbing layer 22 is greater than that in the lower half portion Y of the light-absorbing layer 22. The upper half portion X is proximate to a light incident surface. Referring to FIG. 3, which is a graph of the aluminum and indium content percentages of the light-absorbing layer 22 in the first preferred embodiment of the present invention, the depth within the light-absorbing layer 22 is described by the horizontal axis, and the content (concentration) of aluminum and indium by the vertical axis. When measured closer to the upper half portion X of the light-absorbing layer 22, i.e., closer to the light incident surface, the indium content percentage decreases, and the aluminum content percentage increases. Conversely, when measured closer to the lower half portion Y of the light-absorbing layer 22, the aluminum content percentage decreases, and the indium content percentage increases. In addition, the Al/In ratio can be greater than 1 in the upper half portion X of the light-absorbing layer 22 and less than 1 in the lower half portion Y of the light-absorbing layer 22. The group I element in the light-absorbing layer 22 includes copper (Cu). The group VI element in the light-absorbing layer 22 includes sulfur (S) or selenium (Se). The thickness of the light-absorbing layer 22 is preferably between 1 μm and 3 μm.

Compared with the prior art, the stacked-layered thin film solar cell of the present invention has the following advantages:

Firstly, while the conventional stacked-layered thin film solar cells use indium or gallium heavily, both of which are precious metals and therefore incur high material costs to the detriment of mass production, the stacked-layered thin film solar cell of the present invention uses price-competitive aluminum to replace, in part, the indium or gallium, thereby significantly reducing the material costs.

Secondly, the band of the light-absorbing layer 22 of the present invention can increase from 1.01 eV to 2.7 eV in transition, thereby reducing energy loss incurred when electrons return to their original band after transition across a band gap.

Thirdly, the structure of the stacked-layered thin film solar cell of the present invention is conducive to a decrease in the band gap discontinuity between the buffer layer 23 and the light-absorbing layer 22 and an increase in the probability of electron tunneling.

The back electrode layer 21 is made of a transparent conductive oxide (TCO) selected from the group consisting of tin dioxide ($SnO_2$), indium tin oxide (ITO), zinc oxide (ZnO), aluminum-doped zinc oxide (AZO), gallium-doped zinc oxide (GZO), and indium zinc oxide (IZO). Alternatively, the back electrode layer 21 is a conductive metal layer made of molybdenum (Mo), aluminum (Al), silver (Ag), or platinum (Pt).

The window layer 24 is made of a transparent conductive oxide (TCO) selected from the group consisting of tin dioxide ($SnO_2$), indium tin oxide (ITO), zinc oxide (ZnO), aluminum-doped zinc oxide (AZO), gallium-doped zinc oxide (GZO), and indium zinc oxide (IZO). The top electrode layer 25 includes a metal layer made of silver (Ag), aluminum (Al), chromium (Cr), titanium (Ti), nickel (Ni), or gold (Au).

The buffer layer 23 is made of cadmium sulfide (CdS) or zinc sulfide (ZnS).

Figure 4:
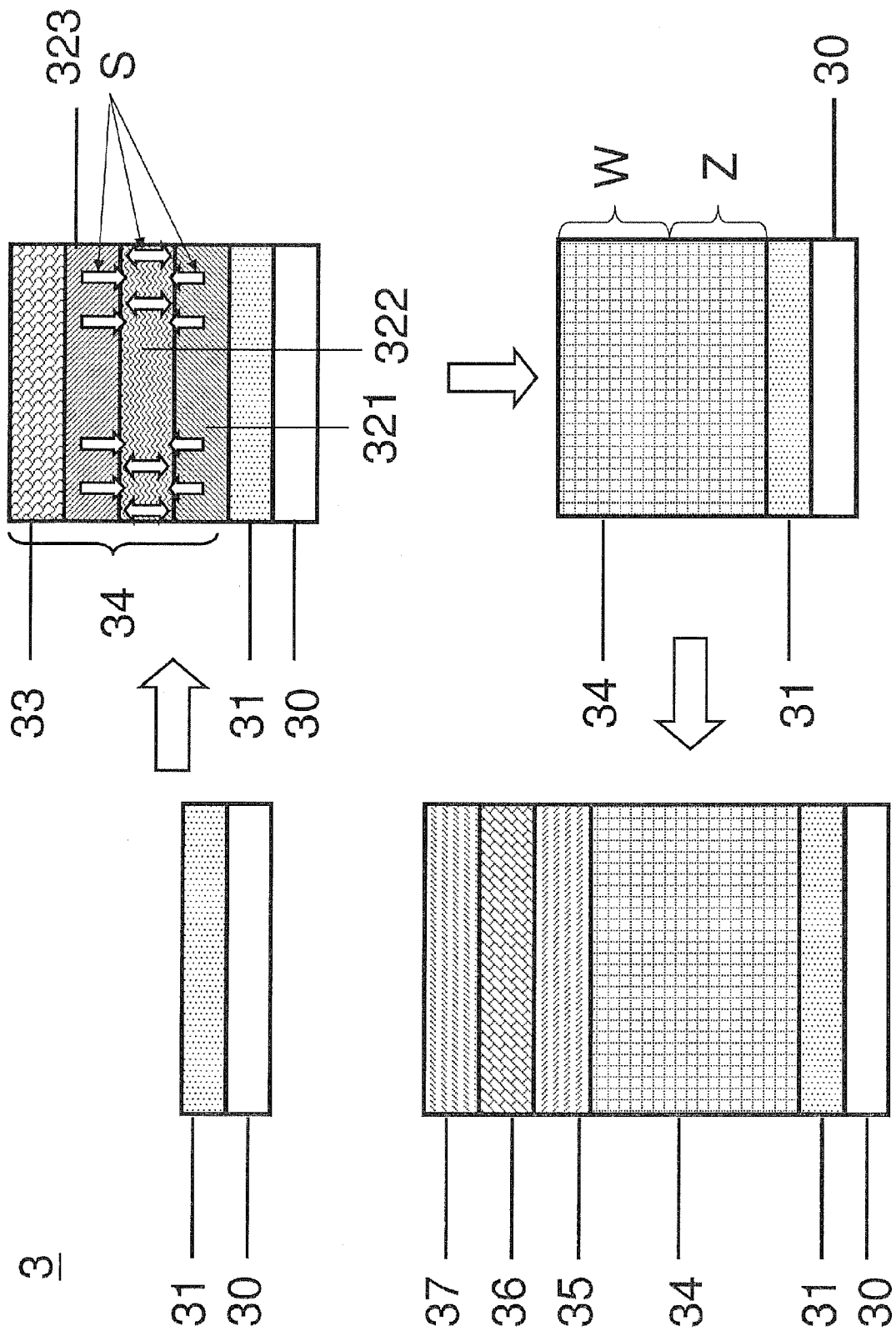
FIG. 4 is a cross-sectional schematic view of a second preferred embodiment of the present invention, namely a method of manufacturing a stacked-layered thin film solar cell with a light-absorbing layer having a band gradient.

Referring to FIG. 4, which is a cross-sectional schematic view of a second preferred embodiment of the present invention, namely a method of manufacturing a stacked-layered thin film solar cell 3 with a light-absorbing layer having a band gradient, the method includes the steps of:

(1) providing a substrate 30;
(2) forming a back electrode layer 31 on the substrate 30;
(3) forming sequentially a first metal layer 321, a second metal layer 322, and a third metal layer 323 on the back electrode layer 31, wherein the first metal layer 321 is a group III element, the second metal layer 322 is a group I element, and the third metal layer 323 is a group III element;
(4) providing a group VI element 33 so as to perform a reaction process S, the reaction process S allowing the first metal layer 321, the second metal layer 322, the third metal layer 323, and the group VI element 33 to form a light-absorbing layer 34 of a I-III-VI compound, wherein the light-absorbing layer 34 has a band gradient, the group III elements at least include indium (In) and aluminum (Al), and the aluminum to indium (Al/In) ratio in the upper half portion W of the light-absorbing layer 34 is greater than that in the lower half portion Z of the light-absorbing layer 34, the upper half portion W being proximate to a light incident surface;
(5) forming a buffer layer 35 on the light-absorbing layer 34;
(6) forming a window layer 36 on the buffer layer 35; and
(7) forming a top electrode layer 37.

The Al/In ratio in the upper half portion W of the light-absorbing layer 34 can be greater than 1. The Al/In ratio in the lower half portion Z of the light-absorbing layer 34 can be less than 1.

The first metal layer 321 is indium (In). The second metal layer 322 includes copper (Cu) while the third metal layer 323 includes aluminum (Al). Alternatively, the second metal layer 322 includes copper (Cu) and aluminum (Al), and the third metal layer 323 includes copper (Cu) and aluminum (Al), wherein the aluminum to copper (Al/Cu) ratio of the third metal layer 323 is preferably greater than that of the second metal layer 322.

The group VI element includes sulfur (S) or selenium (Se).

The first metal layer 321, the second metal layer 322, and the third metal layer 323 are formed by sputtering deposition. The reaction process S is preferably selenization. The thickness of the light-absorbing layer 34 is preferably between 1 μm and 3 μm.

The method of the present invention is further illustrated with the following examples. For instance, after the substrate 30 and the back electrode layer 31 are formed, indium (In), copper (Cu), and aluminum (Al) are sequentially sputtered onto the back electrode layer 31. Then, a selenization process is performed at between 500° C. and 550° C., so as for indium (In) and aluminum (Al) to diffuse toward each other and thereby form the light-absorbing layer 34. The thickness of the light-absorbing layer 34 is controlled at between 1 μm and 3 μm. Owing to the diffusion, the aluminum to indium (Al/In) ratio in the upper half portion W of the light-absorbing layer 34 is greater than that in the lower half portion Z of the light-absorbing layer 34. Accordingly, a copper indium aluminum selenide compound, such as $Cu(In_xAl_{1-x})Se2$, with a band gradient is formed.

As another example, after the substrate 30 and the back electrode layer 31 are formed, indium (In), a compound of copper (Cu) and aluminum (Al), and another compound of copper (Cu) and aluminum (Al) are sequentially sputtered onto the back electrode layer 31. Afterward, a selenization process is performed at between 500° C. and 550° C., so as for indium (In) and aluminum (Al) to diffuse toward each other and thereby form the light-absorbing layer 34. The thickness of the light-absorbing layer 34 is controlled at between 1 μm and 3 μm. Owing to the diffusion, the aluminum to indium (Al/In) ratio in the upper half portion W of the light-absorbing layer 34 is greater than that in the lower half portion Z of the light-absorbing layer 34. Accordingly, a copper indium aluminum selenide compound, such as $Cu(In_xAl_{1-x})Se_2$, with a band gradient is formed.

The foregoing embodiments are illustrative of the characteristics of the present invention so as to enable a person skilled in the art to understand the disclosed subject matter and implement the present invention accordingly. The embodiments, however, are not intended to restrict the scope of the present invention. Hence, all equivalent modifications and variations which do not depart from the spirit and principle of the present invention should fall within the scope of the appended claims.

What is claimed is:

1. A method of manufacturing a stacked-layered thin film solar cell with a light-absorbing layer having a band gradient, comprising steps of:
   providing a substrate;
   forming a back electrode layer on the substrate;
   forming sequentially
      a first metal layer,
      a second metal layer, and
      a third metal layer on the back electrode layer,
   wherein the first metal layer, the second metal layer, and the third metal layer comprise a group III element, a group I element, and a group III element, respectively;
   providing a group VI element and a reaction process
      for allowing the first metal layer, the second metal layer, the third metal layer, and the group VI element to form a light-absorbing layer of a I-III-VI compound,
      wherein the light-absorbing layer
         has a band gradient,
         the group III elements comprise indium (In) and aluminum (Al), and
         an aluminum to indium (Al/In) ratio in an upper half portion of the light-absorbing layer is greater than that in a lower half portion of the light-absorbing layer,
         the upper half portion being proximate to a light incident surface;
   forming a buffer layer on the light-absorbing layer;
   forming a window layer on the buffer layer; and
   forming a top electrode layer.

2. The method of claim 1, wherein the aluminum to indium (Al/In) ratio in the upper half portion of the light-absorbing layer is greater than 1.

3. The method of claim 1, wherein the aluminum to indium (Al/In) ratio in the lower half portion of the light-absorbing layer is less than 1.

4. The method of claim 1, wherein the first metal layer is indium (In).

5. The method of claim 1, wherein the second metal layer and the third metal layer comprise copper (Cu) and aluminum (Al), respectively.

6. The method of claim 1, wherein the second metal layer comprises copper (Cu) and aluminum (Al), and the third metal layer comprises copper (Cu) and aluminum (Al) and has an aluminum to copper (Al/Cu) ratio greater than the second metal layer.

7. The method of claim 1 (see the rejection of claim 1 above),
   wherein the group VI element is sulfur (S).

8. The method of claim 1 (see the rejection of claim 1 above),
   wherein the group VI element is selenium (Se).

9. The method of claim 1, wherein the first metal layer, the second metal layer, and the third metal layer are formed by sputtering deposition.

10. The method of claim 1, wherein the reaction process is selenization.

11. The method of claim 1, wherein the light-absorbing layer has a thickness between 1 µm and 3 µm.

12. The method of claim 1, wherein the back electrode layer is made of a transparent conductive oxide (TCO) selected from the group consisting of tin dioxide ($SnO_2$), indium tin oxide (ITO), zinc oxide (ZnO), aluminum-doped zinc oxide (AZO), gallium-doped zinc oxide, and indium zinc oxide (IZO).

13. The method of claim 1, wherein the back electrode layer is a conductive metal layer made of one selected from the group consisting of molybdenum (Mo), aluminum (Al), silver (Ag), and platinum (Pt).

14. The method of claim 1, wherein the window layer is made of a transparent conductive oxide (TCO) selected from the group consisting of tin dioxide ($SnO_2$), indium tin oxide (ITO), zinc oxide (ZnO), aluminum-doped zinc oxide (AZO), gallium-doped zinc oxide (GZO), and indium zinc oxide (IZO).

15. The method of claim 1, wherein the top electrode layer comprises a metal layer made of one selected from the group consisting of silver (Ag), aluminum (Al), chromium (Cr), titanium (Ti), nickel (Ni), and gold (Au).

16. The method of claim 1, wherein the buffer layer is made of cadmium sulfide (CdS).

17. The method of claim 1, wherein the buffer layer is made of zinc sulfide (ZnS).

\* \* \* \* \*